(12) United States Patent
Heo et al.

(10) Patent No.: US 12,316,796 B2
(45) Date of Patent: May 27, 2025

(54) STRUCTURE FOR APPLYING MILLIMETER WAVE ANTENNA MODULE TO FOLDABLE ELECTRONIC DEVICE

(71) Applicant: Samsung Electronics Co., Ltd., Suwon-si (KR)

(72) Inventors: Joon Heo, Suwon-si (KR); Sungsoo Kim, Suwon-si (KR); Seyoon Bae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 384 days.

(21) Appl. No.: 17/860,836

(22) Filed: Jul. 8, 2022

(65) Prior Publication Data

US 2022/0345559 A1    Oct. 27, 2022

Related U.S. Application Data

(63) Continuation of application No. PCT/KR2021/010814, filed on Aug. 13, 2021.

(30) Foreign Application Priority Data

Aug. 14, 2020 (KR) .......................... 10-2020-0102656

(51) Int. Cl.
*H04W 48/12* (2009.01)
*G06F 1/16* (2006.01)
(Continued)

(52) U.S. Cl.
CPC ........ *H04M 1/0277* (2013.01); *G06F 1/1652* (2013.01); *G06F 1/1681* (2013.01);
(Continued)

(58) Field of Classification Search
CPC ............. H04M 1/0277; H04M 1/0216; H04M 1/0268; H04M 1/0262; G06F 1/1652;
(Continued)

(56) References Cited

U.S. PATENT DOCUMENTS 10,110,267 B2    10/2018  Kim et al.
11,139,554 B2 *  10/2021  Yoon ...................... H01Q 5/328
(Continued)

FOREIGN PATENT DOCUMENTS

CN         109193115 A      1/2019
EP         4 167 374 A1     4/2023
(Continued)

OTHER PUBLICATIONS

Extended European Search Report dated Dec. 4, 2023, issued in European Patent Application No. 21856289.0.

(Continued)

*Primary Examiner* — Julio R Perez
(74) *Attorney, Agent, or Firm* — Jefferson IP Law, LLP

(57) ABSTRACT

An electronic device is provided. The electronic device includes a first housing, a second housing coupled to the first housing through a hinge structure to be rotatable about a first axis that faces a first direction, a first cover covering a rear surface of the first housing, a second cover covering a rear surface of the second housing, a flexible display defining a front surface of the electronic device and disposed over the first housing and the second housing, an antenna module, and at least one processor electrically connected to the flexible display and the antenna module, wherein the hinge structure is disposed in an area having a first width in a second direction that is perpendicular to the first direction with respect to the first axis, wherein the first housing has a first structure covering the hinge structure within the first width, wherein the first structure has an accommodation groove, in which the antenna module is accommodated, and wherein the at least one processor is configured to transmit and receive a high-frequency (millimeter wave) signal corresponding to a third direction that is perpendicular to both (Continued)

the first direction and the second direction by using the antenna module.

22 Claims, 14 Drawing Sheets

(51) Int. Cl.
*G06F 1/20* (2006.01)
*H01Q 1/24* (2006.01)
*H01Q 21/06* (2006.01)
*H04M 1/02* (2006.01)

(52) U.S. Cl.
CPC ............ *G06F 1/1698* (2013.01); *G06F 1/203* (2013.01); *H01Q 1/243* (2013.01); *H01Q 21/065* (2013.01); *H04M 1/0216* (2013.01); *H04M 1/0268* (2013.01)

(58) Field of Classification Search
CPC ...... G06F 1/1681; G06F 1/1698; G06F 1/203; H01Q 1/243; H01Q 21/065; H01Q 1/38; H01Q 21/0025; H01Q 21/06; H01Q 21/28; H01Q 21/061; H05K 5/03; H05K 7/20; H05K 1/189; H05K 7/2039
See application file for complete search history.

(56) References Cited

U.S. PATENT DOCUMENTS

| | | | |
|---|---|---|---|
| 11,432,418 B2* | 8/2022 | Yoon | H05K 7/1427 |
| 11,800,667 B2* | 10/2023 | Oh | H01Q 1/243 |
| 11,901,610 B2 | 2/2024 | Kim et al. | |
| 2012/0112972 A1 | 5/2012 | Ogawa | |
| 2016/0018856 A1 | 1/2016 | Heo et al. | |
| 2018/0088633 A1 | 3/2018 | Whitman et al. | |
| 2018/0366813 A1 | 12/2018 | Kim et al. | |
| 2020/0051468 A1 | 2/2020 | Jung et al. | |
| 2020/0136231 A1 | 4/2020 | Lee et al. | |
| 2020/0333855 A1 | 10/2020 | Kim et al. | |
| 2021/0216108 A1* | 7/2021 | Lee | G06F 1/1652 |
| 2021/0328329 A1 | 10/2021 | Kim et al. | |
| 2022/0061175 A1 | 2/2022 | Oh et al. | |
| 2022/0158124 A1* | 5/2022 | Koo | H10K 50/84 |
| 2022/0338360 A1* | 10/2022 | Delaporte | G06F 3/011 |
| 2022/0345559 A1* | 10/2022 | Heo | H01Q 21/06 |
| 2023/0104268 A1* | 4/2023 | Do | H01Q 1/2225 343/702 |

FOREIGN PATENT DOCUMENTS

| | | |
|---|---|---|
| KR | 10-2005-0108991 A | 11/2005 |
| KR | 10-1005771 B1 | 1/2011 |
| KR | 10-2020-0025439 A | 3/2020 |
| KR | 10-2020-0031607 A | 3/2020 |
| KR | 10-2020-0046303 A | 5/2020 |
| KR | 10-2020-0072190 A | 6/2020 |
| WO | 2020/046032 A2 | 3/2020 |

OTHER PUBLICATIONS

Korean Notice of Patent Grant dated Jul. 1, 2024, issued in Korean Application No. 10-2020-0102656.

* cited by examiner

STRUCTURE FOR APPLYING MILLIMETER WAVE ANTENNA MODULE TO FOLDABLE ELECTRONIC DEVICE

CROSS-REFERENCE TO RELATED APPLICATION(S)

This application is a continuation application, claiming priority under § 365(c), of an International application No. PCT/KR2021/010814, filed on Aug. 13, 2021, which is based on and claims the benefit of a Korean patent application number 10-2020-0102656, filed on Aug. 14, 2020, in the Korean Intellectual Property Office, the disclosure of which is incorporated by reference herein in its entirety.

TECHNICAL FIELD

The disclosure relates to a foldable electronic device including a millimeter wave antenna module.

BACKGROUND ART

A mobile electronic device includes multiple antenna radiators for transmitting and/or receiving signals in various frequency bands. For example, the multiple antenna radiators are designed to be able to transmit/receive radio signals in a designated frequency band (for example, low band (LB) or high band (HB)).

Foldable electronic devices having a hinge structure for improved portability have recently appeared. A foldable electronic device includes two different housings through a hinge structure, and the two housings can rotate relatively around the hinge structure to be folded or unfolded.

Foldable electronic devices may be classified into H-fold types and V-fold types according to the direction in which the folding axis faces. For example, an H-fold-type electronic device may be folded around a horizontal direction such that the upper and lower ends thereof face each other. In addition, a V-fold-type electronic device may be folded around a vertical direction such that the left and right edges thereof face each other.

Meanwhile, recent electronic devices have array antennas configured to support communication using a high frequency (for example, millimeter wave (mmWave) such as 5G. In the case of array antennas, the directivity becomes noticeable compared with legacy bands, due to high target frequency bands. Therefore, the position and direction in which array antennas are disposed have been considered important in the case of mobile terminals having limited spaces for disposition.

The above information is presented as background information only to assist with an understanding of the disclosure. No determination has been made, and no assertion is made, as to whether any of the above might be applicable as prior art with regard to the disclosure.

DISCLOSURE

Technical Problem

A foldable electronic device requires an additional space to dispose an antenna module, which otherwise needs to be disposed so as to overlap an existing component.

Meanwhile, if an antenna module is disposed while overlapping another electronic component of the foldable electronic device, interference may occur in antenna radiation, thereby degrading the antenna radiation performance. Therefore, it may be necessary to dispose the antenna module to be spaced apart from other electronic components.

Aspects of the disclosure are to address at least the above-mentioned problems and/or disadvantages and to provide at least the advantages described below. Accordingly, an aspect of the disclosure is to provide a method and a device for improving the antenna radiation performance by disposing a high-frequency (for example, mmWave) antenna module on a part of a structure that covers a hinge structure of a foldable electronic device.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a first housing, a second housing coupled to the first housing through a hinge structure to be rotatable about a first axis that faces a first direction, a flexible display defining a front surface of the electronic device and disposed over the first housing and the second housing, an antenna module, and at least one processor electrically connected to the flexible display and the antenna module, wherein the hinge structure is disposed in an area having a first width in a second direction that is perpendicular to the first direction with respect to the first axis, wherein the first housing has a first structure covering the hinge structure within the first width, wherein the first structure has an accommodation groove, in which the antenna module is accommodated, and wherein the at least one processor is configured to transmit and receive a millimeter wave signal corresponding to a third direction that is perpendicular to both the first direction and the second direction by using the antenna module.

In accordance with another aspect of the disclosure, an electronic device is provided. The electronic device includes a first housing, a second housing coupled to the first housing through a hinge structure to be rotatable about a first axis that faces a first direction, a first cover covering a rear surface of the first housing, a second cover covering a rear surface of the second housing, an antenna module, and at least one processor electrically connected to the antenna module, wherein the hinge structure is disposed in an area having a first width in a second direction that is perpendicular to the first direction with respect to the first axis, wherein the first housing has a first structure covering the hinge structure within the first width, wherein the first structure has an accommodation groove, in which the antenna module is accommodated, and wherein the at least one processor is configured to transmit and receive a mmWave signal corresponding to a third direction that is perpendicular to both the first direction and the second direction by using the antenna module.

Advantageous Effects of Disclosure

An electronic device according to the disclosure may have an antenna module disposed in a predetermined space of a structure that covers a hinge structure such that the same is spaced apart from other electronic components of the electronic device, thereby improving the antenna radiation performance.

In addition, the electronic device may have an antenna module disposed in a predetermined space of a structure that covers the hinge structure thereof such that a larger space for a battery is secured, thereby increasing the battery accommodation capacity.

In addition, even if the electronic device is gripped transversely, the antenna module may be disposed outside the gripping area, thereby reducing degradation of the antenna radiation performance due to gripping of the electronic device.

Furthermore, the antenna module may be disposed adjacent to the hinge structure of the electronic device including a metallic material such that the heat dissipation performance can be improved by facilitating heat diffusion along the hinge structure, and the improved heat dissipation performance may increase the time during which transmission/reception of a mmWave signal is maintained.

Various other advantageous effects inferred directly or indirectly through this document may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer like parts, components, and structures.

BEST MODE FOR CARRYING OUT THE DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
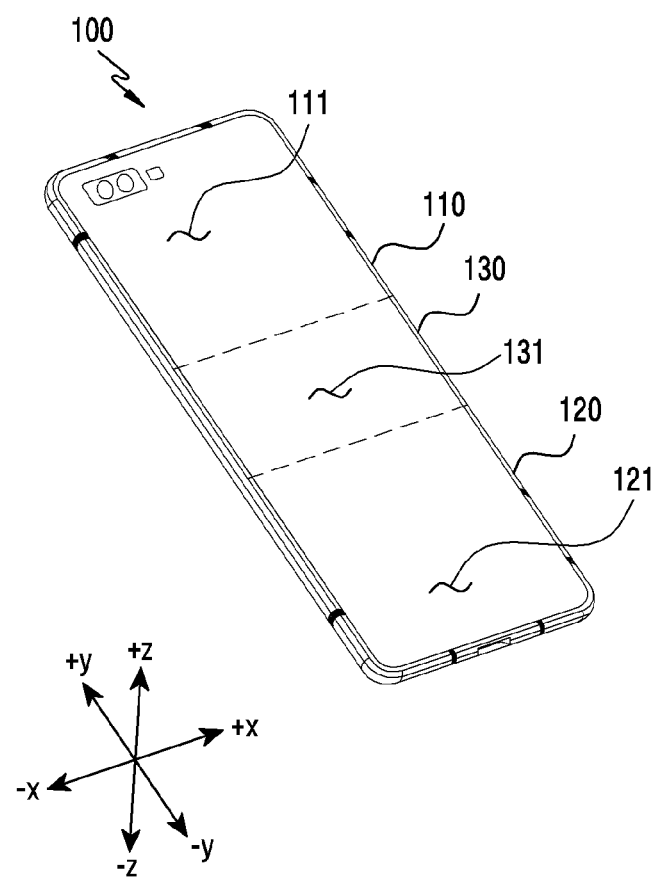
FIG. 1A illustrates a perspective view of an electronic device in an unfolded state according to an embodiment of the disclosure.

FIG. 1A illustrates a perspective view of an electronic device in an unfolded state according to an embodiment of the disclosure.

Figure 1B:
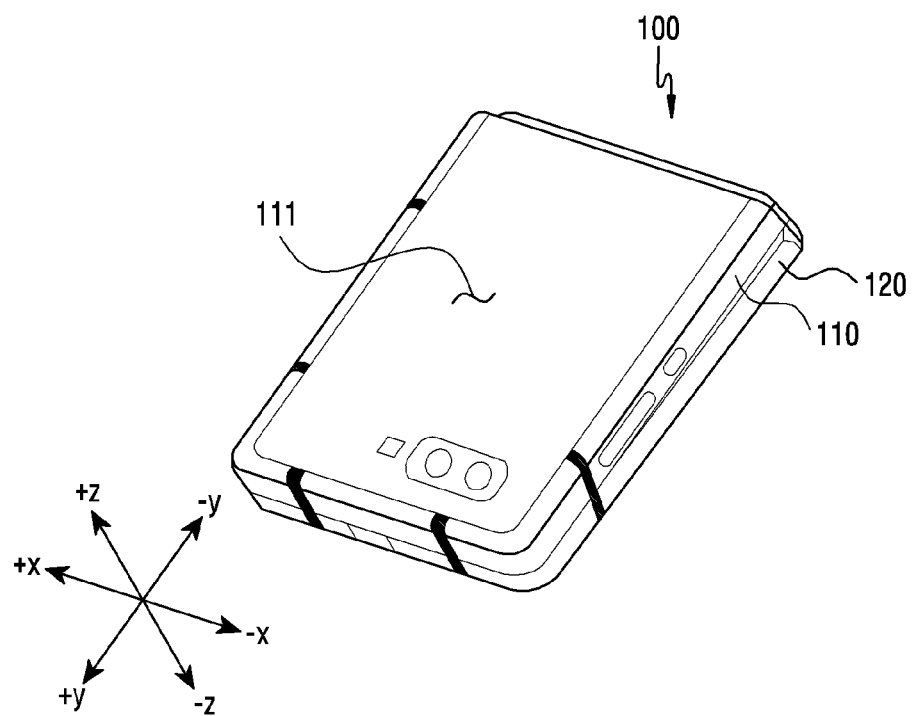
FIG. 1B illustrates a perspective view of an electronic device in a folded state according to an embodiment of the disclosure.

FIG. 1B illustrates a perspective view of an electronic device in a folded state according to an embodiment of the disclosure.

Referring to FIGS. 1A and 1B, an electronic device 100 according to various embodiments may include a first housing 110, a second housing 120, and a hinge area 130.

According to an embodiment, a second housing 120 may be coupled to a first housing 110 through a hinge structure (not illustrated) that defines at least a portion of a hinge area 130 to be rotatable about a first axis (the x axis) that faces a first direction (e.g., the +x axis direction). In an example, a structure, in which the first housing 110 and the second housing 120 may be folded with respect to the +x axis direction or the −x axis direction (or the "transverse direction"), is illustrated, but the disclosure is not limited thereto. According to another embodiment, the first housing 110 and the second housing 120 may be folded with respect to the +y axis direction or the −y axis direction (or the "longitudinal direction").

According to an embodiment, the hinge area 130 may be an area, in which the first housing 110 is connected to the hinge structure (not illustrated). For example, the hinge area 130 may correspond to one area of the first housing 110, which is connected to the hinge structure (not illustrated) and located adjacent to the hinge structure (not illustrated).

According to an embodiment, a rear surface (e.g., a surface of the first housing 110, which is located in the +z axis direction) of the first housing 110 may be covered by a first cover 111, and a rear surface of the second housing 120 may be covered by a second cover 121. In an example, the first cover 111 and the second cover 121 may be formed of a nonconductive material. As another example, the first cover 111 and/or the second cover 121 may be formed of a conductive material, and at least a portion thereof may include a nonconductive material. For example, at least a portion of an area corresponding to a first antenna module 210 of the first cover 111 and/or the second cover 121 may be formed of a nonconductive material.

According to an embodiment, at least a portion of the first housing 110 may have a first structure 131 that covers the hinge area 130. For example, the hinge area 130 may be disposed at least a portion of the first housing 110, and the first structure 131 may be formed to cover the hinge area 130.

Figure 2:
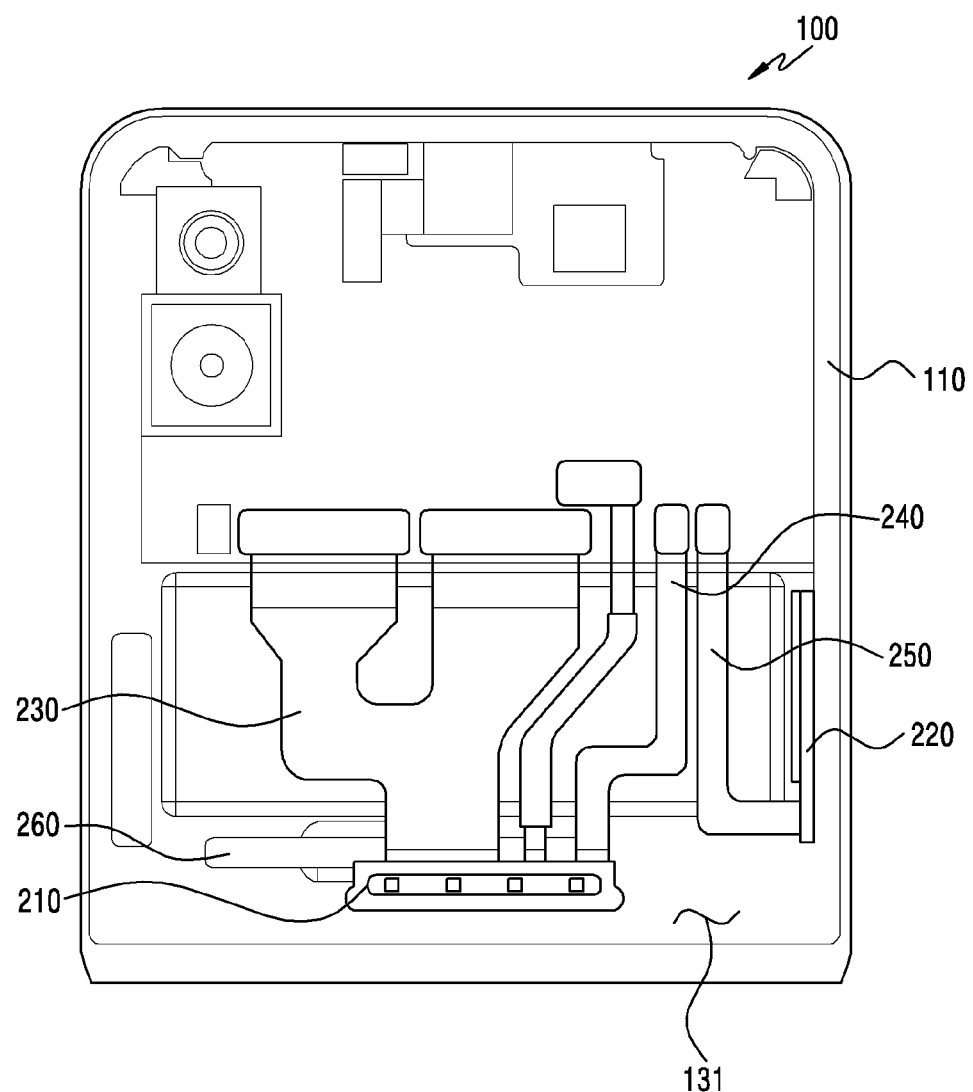
FIG. 2 illustrates a first housing and an antenna of an electronic device according to an embodiment of the disclosure.

FIG. 2 illustrates a first housing and an antenna of an electronic device according to an embodiment of the disclosure.

Referring to FIG. 2, a first antenna module 210, a second antenna module 220, an electrical connection member 230, a first flexible printed circuit board (FPCB) radio frequency (RF) cable (FRC) 240, a second FRC 250, and a printed circuit board (not illustrated) may be disposed in a space defined by the first housing 110.

In an embodiment, the first antenna module 210 and/or the second antenna module 220 may be an array antenna in a patch form. For example, the first antenna module 210 may be an array antenna having fourth conductive patches. In another embodiment, the first antenna module 210 and/or the second antenna module 220 may be an array antenna in a dipole form. For example, the first antenna module 210 may be an array antenna in a patch form, and the second antenna module 220 may be an array antenna in a dipole form. The first antenna module 210 may be an array antenna in a dipole form, and the second antenna module 220 may be an array antenna in a patch form.

According to an embodiment, a printed circuit board disposed in the first housing 110 may be electrically connected to a printed circuit board (not illustrated) disposed in the second housing 120 through the electrical connection member 230. In an example, the electrical connection member 230 may electrically connect the printed circuit board disposed in the first housing 110 to cross at least an area of the first housing 110, the hinge area 130, and/or at least an area of the second housing 120 and the printed circuit board disposed in the second housing 120. In another example, the electrical connection member 230 may be formed of a material having flexible characteristics, and the electronic device 100 may be rotated from a folded state to an unfolded state, or at least an area of the electronic device 100 may be bent in an operation of the electronic device 100 being rotated from the unfolded state to the folded state. The electrical connection member 230, for example, may be at least one of a signal wiring line, a coaxial cable, and an FPCB, but the disclosure is not limited thereto.

According to an embodiment, a hole 260 may be formed in an area of the first housing 110. In an example, the electrical connection member 230 may be connected to an area of the second housing 120 through the hole 260 disposed in an area of the first housing 110. In another example, the first FRC 240 may be inserted into a rear surface of the first antenna module 210 through the hole 260, and may be seated in an area of the first housing 110.

In an embodiment, the first FPCB RF cable (FRC) 240 and the second FRC 250 may have a structure that is similar to that of the electrical connection member 230, but may be understood as an FPCB for transmitting and receiving a high frequency (e.g., millimeter wave) signal. For example, the first antenna module 210 may transmit a millimeter wave signal to an external device through the first FRC 240, or may receive a millimeter wave signal transmitted by the external device through the first FRC 240.

Figure 3:
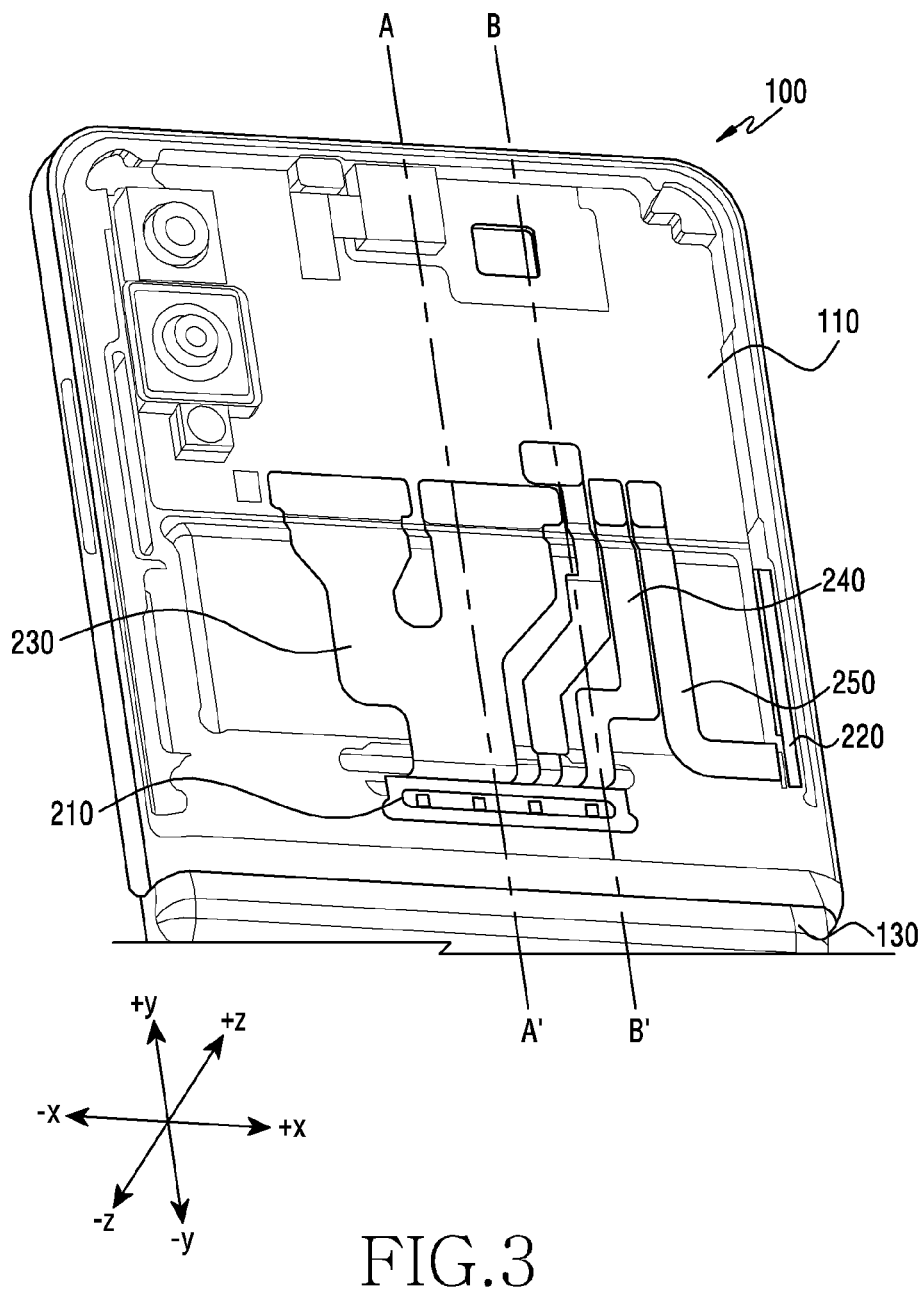
FIG. 3 illustrates a state, in which a first cover covering a hinge structure is removed from an electronic device of the embodiment of FIG. 2 according to an embodiment of the disclosure.

FIG. 3 illustrates a state, in which the first cover is removed from the electronic device of the embodiment of FIG. 2 according to an embodiment of the disclosure.

Referring to FIG. 3, the first antenna module 210 may be disposed such that the patches face a first direction (e.g., a direction of the rear surface of the electronic device or the +z axis direction), and the second antenna module 220 may be disposed to be perpendicular to the first antenna module 210. In an embodiment, the location of the second antenna module 220 may be variously changed, and the second antenna module 220 may be disposed to face a direction that is the same as or opposite to the first antenna module 210. The electronic device 100 may further include an additional antenna module disposed to be perpendicular to both of the first antenna module 210 and the second antenna module 220.

According to an embodiment, the antenna radiation of the first antenna module 210 may be performed in a third direction (e.g., the +z axis direction) that is perpendicular to the first direction (e.g., the +x axis direction) that faces the first axis (the x axis), about which the first housing 110 and the second housing 120 are rotatable, and the second direction (e.g., the +y axis direction) that faces the second axis (the y axis) defined by the first antenna module 210 and the hinge area 130 while being perpendicular to the first direction. For example, the first antenna module 210 may perform antenna radiation in a direction, which the rear surface of the electronic device 100 faces.

According to an embodiment, the second antenna module 220 may perform antenna radiation in the first direction (e.g., the +x axis direction) or the second direction (e.g., the +y axis direction). In an embodiment, the second antenna module 220 may be disposed at least a portion of the first housing 110 in parallel to the first axis to perform antenna radiation in the second direction that is perpendicular to the first direction. In an embodiment, the second antenna module 220 may be disposed at least a portion of the first housing 110 in parallel to the second axis that is perpendicular to the first axis to perform antenna radiation in the first direction that is perpendicular to the second direction.

According to an embodiment, the first antenna module 210 and/or the second antenna module 220 may transmit and receive a high frequency (e.g., millimeter wave) signal. For example, the first antenna module 210 and/or the second antenna module 220 may transmit and receive a signal at a frequency band of 24.25 GHz and/or 40 GHz.

In an embodiment, any one of the first antenna module 210 or the second antenna module 220 may not be disposed in the first housing 110. For example, only the first antenna module 210 may be disposed in the first housing 110.

Figure 4:
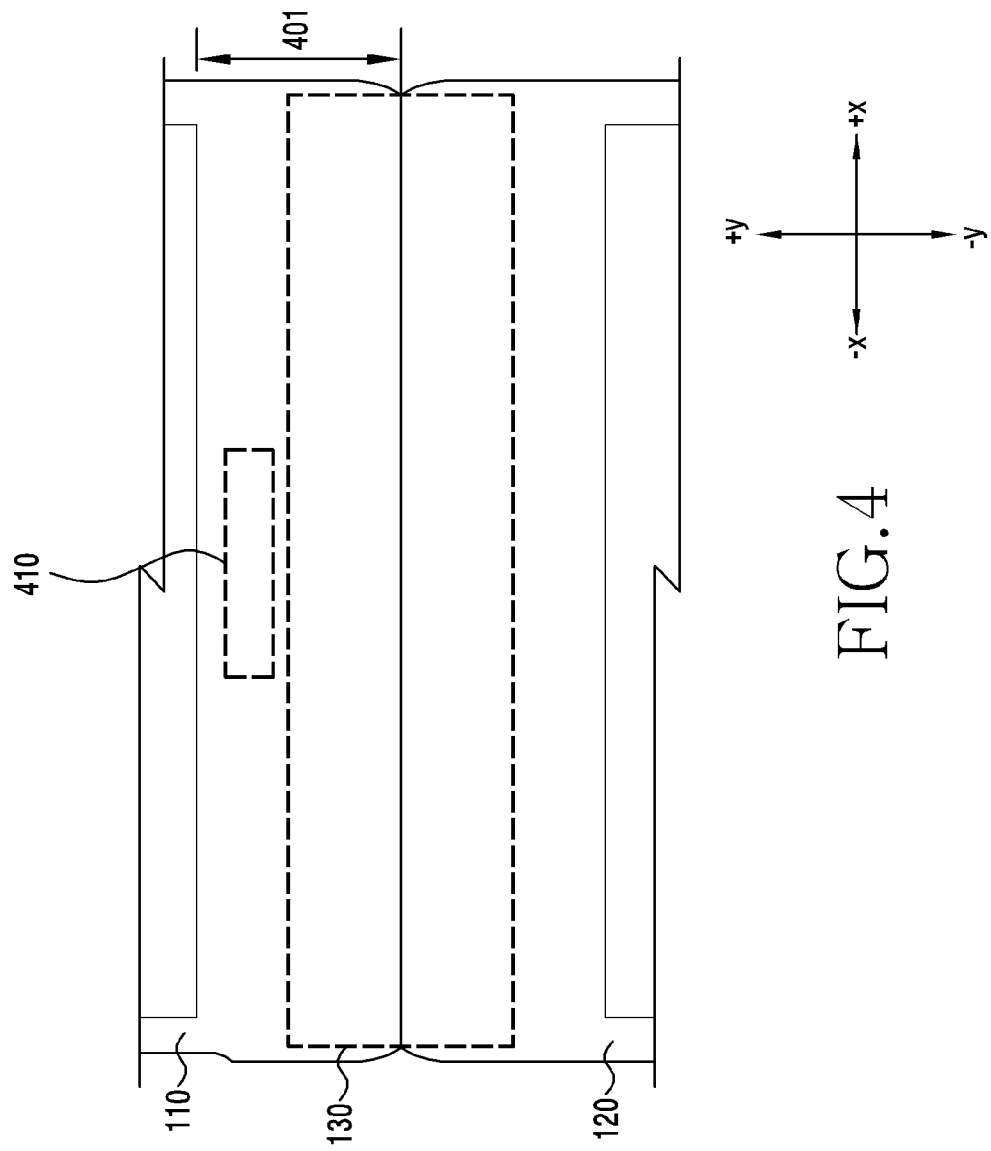
FIG. 4 illustrates an accommodation groove, in which an antenna module is disposed, in an electronic device according to an embodiment of the disclosure.

FIG. 4 illustrates an accommodation groove, in which a first antennal module is disposed, in an electronic device according to an embodiment of the disclosure.

Referring to FIG. 4, an accommodation groove 410 may be disposed in at least a partial area of the hinge area 130 of the first housing 110. For example, the hinge structure (not illustrated) may be disposed in the hinge area 130, and at least a portion of the accommodation groove 410 may be disposed in an area of the hinge structure. A hole may be disposed in a partial area of the accommodation groove 410.

The first antenna module 210 may be disposed in at least a partial area which is included in the first housing 110 and does not include the hinge area 130 connecting the first housing 110 and the second housing 120. According to an embodiment, the first antenna module 210 may be disposed in an area 401 having a first width in a second direction (e.g., the +y axis direction or the −y axis direction) that is perpendicular to a first direction (e.g., the +x axis direction or the −x axis direction) with respect to the first axis (the x axis).

According to another embodiment, the first antenna module 210 also may be disposed in the second housing 120. In an embodiment, the first antenna module 210 may be disposed in an area that is included in the second housing 120 and does not include the hinge structure (not illustrated).

Figure 5:
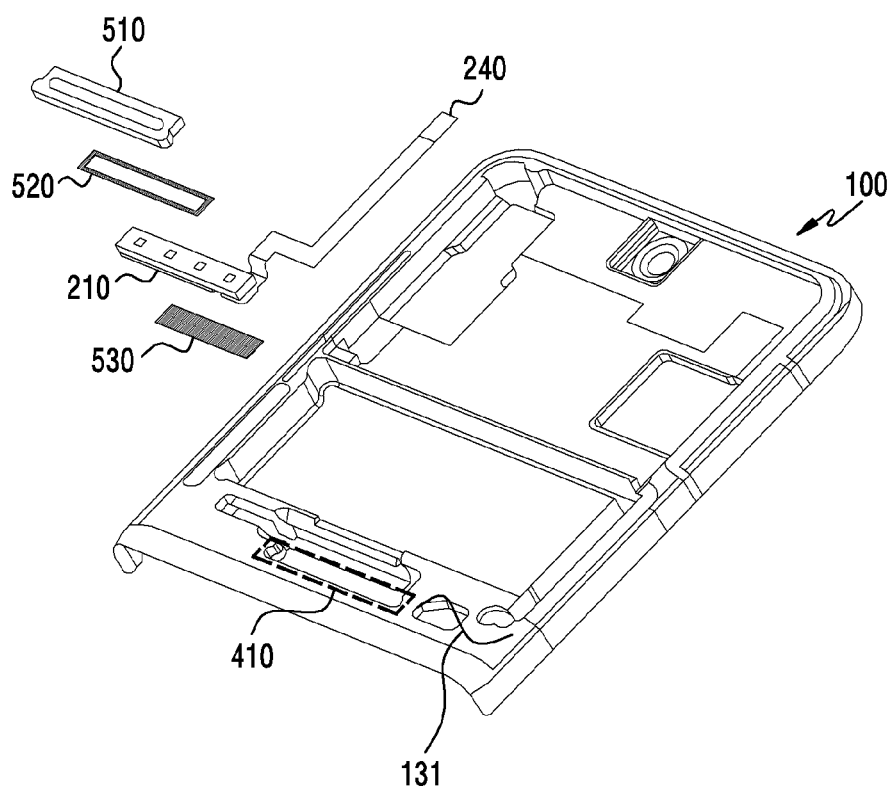
FIG. 5 is an exploded perspective view of a first antenna module and a fixing part that fixes the first antenna module to an accommodation groove according to an embodiment of the disclosure.

FIG. 5 is an exploded perspective view of a first antenna module and a fixing part that fixes the first antenna module to an accommodation groove according to an embodiment of the disclosure.

Referring to FIG. 5, the first antenna module 210 may be fixed to the accommodation groove 410 provided in the first structure 131 that covers the hinge structure (not illustrated).

In an embodiment, the first antenna module 210 may be fixed to the accommodation groove 410 provided in the first structure 131, together with a fixing cap 510, a first adhesive 520 that fixes the fixing cap 510, and a second adhesive 530 located on a surface of the first antenna module 210, which is different from a surface of the first antenna module, on which the first adhesive 520 is located. For example, the second adhesive 530 may be disposed at a portion that contacts the accommodation groove, the first adhesive 520 may be disposed on a surface of the first antenna module 210, which is opposite to a surface of the first antenna module 210, which contacts the second adhesive 530, and the fixing cap 510 may be bonded to the first antenna module 210 through the first adhesive 520, whereby the first antenna module 210 may be accommodated in the accommodation groove 410 while being fixed to the accommodation groove 410. In another embodiment, the first antenna module 210 may be fixed to the accommodation groove 410 provided in the first structure 131 together with a fixing member (not illustrated) (e.g., a screw or a coupling boss).

In an embodiment, the first antenna module 210 accommodated in the accommodation groove 410 may be electrically connected to a wireless communication circuit (e.g., a communication processor (CP)) and/or a transceiver through the first FRC 240 electrically connected thereto.

In an embodiment, the accommodation groove 410, in which the first antenna module 210 is accommodated, may be formed of a metallic material. In an example, because the accommodation groove 410, in which the first antenna module 210 is accommodated, is formed of a metallic material, the first antenna module 210 may be electrically connected to a ground area through the accommodation groove 410.

In an embodiment, at least a portion of the first antenna module 210 is accommodated in the accommodation groove 410 formed of a conductive (e.g., metallic) material, and may be electrically connected to the ground area through the accommodation groove 410. The first antenna module 210 may perform antenna radiation while at least a portion of the rear surface (one surface of the electronic device 1000 located in the +z axis direction of FIG. 1A) of the electronic device 100 is taken as the ground area. In an embodiment, the first antenna module 210 may perform antenna radiation while an area including the first housing 110, the second housing 120, and a conductive area of at least a portion of the hinge area 130 electrically connected to the first housing 110 and the second housing 120 is taken as the ground area.

In an embodiment, at least a portion of the accommodation groove disposed in the first housing 110 may include a metallic or heat transfer member, and the heat generated by the first antenna module 210 seated in the accommodation groove 410 may be transferred to another area of the first housing 110.

In an embodiment, a heat dissipating structure (not illustrated) may be included in the interior of the electronic device 100. For example, the heat dissipating structure included in the interior of the electronic device 100 may correspond to at least one of a graphite bracket or a metal bracket.

Figure 6:
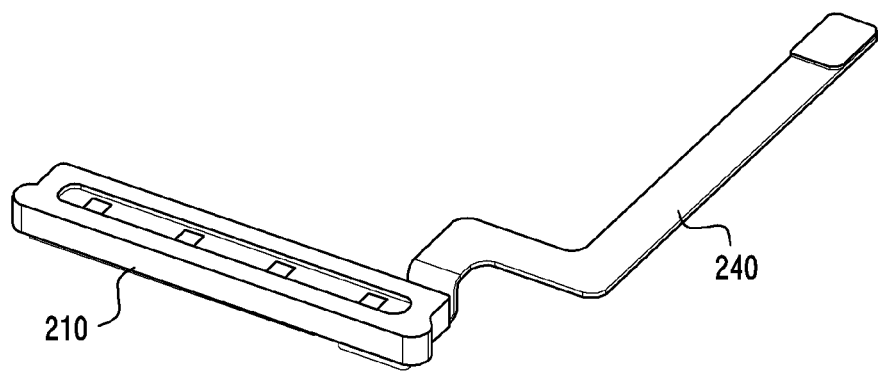
FIG. 6 illustrates a form, in which antenna module related components illustrated in FIG. 5 are coupled according to an embodiment of the disclosure.

FIG. 6 is a form, in which antenna module related components illustrated in FIG. 5 are coupled according to an embodiment of the disclosure.

Referring to FIG. 6, the first antenna module 210 may be coupled to the accommodation groove 410, together with a fixing cap 510, a first adhesive 520 that fixes the fixing cap 510, and a second adhesive 530 located on a surface of the first antenna module 210, which is different from a surface of the first antenna module, on which the first adhesive 520 is located, to be electrically connected to the first FRC 240 while being accommodated in the accommodation groove 410.

According to an embodiment, the first antenna module 210 accommodated in the accommodation groove 410 may be electrically connected to the first FRC 240 to transmit and receive a high frequency (e.g., millimeter wave) signal. For example, the first antenna module 210 may be electrically connected to the first FRC 240 to transmit and receive a signal at a frequency band of 24.25 GHz and/or 40 GHz.

Figure 7A:
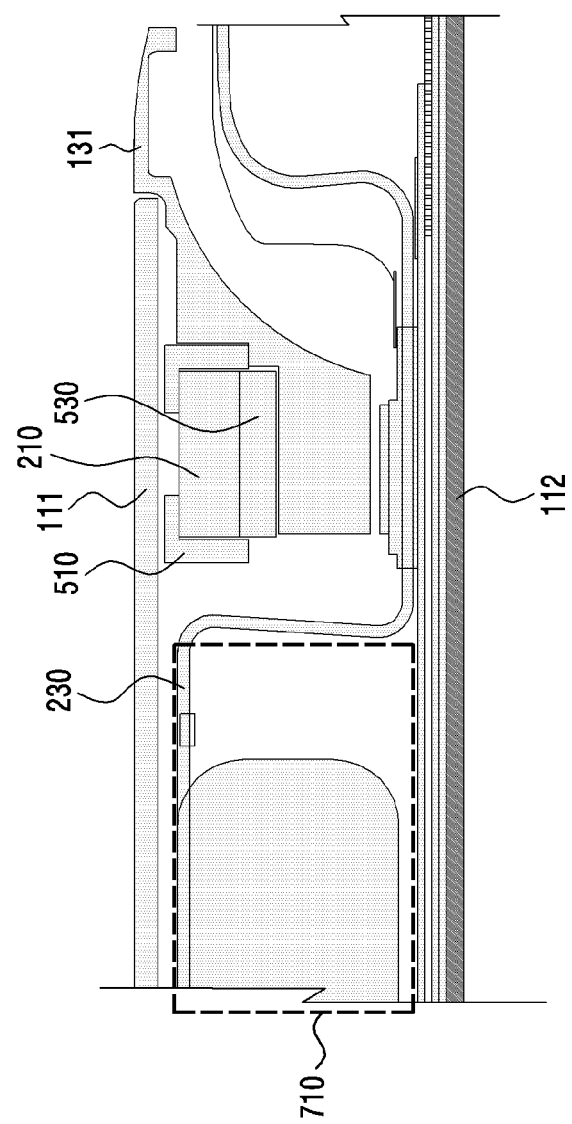
FIG. 7A is a side perspective view of an electronic device 100 including an electrical connection member according to an embodiment of the disclosure.

FIG. 7A is a side perspective view of an electronic device including an electrical connection member according to an embodiment of the disclosure.

Figure 7B:
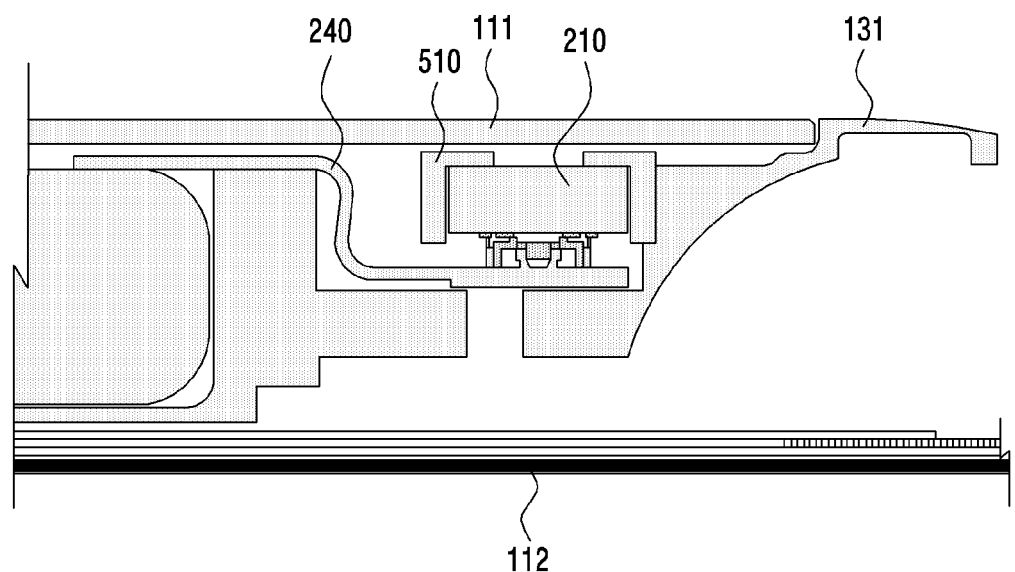
FIG. 7B is a side perspective view of an electronic device including a first FRC according to an embodiment of the disclosure.

FIG. 7B is a side perspective view of an electronic device including a first FRC according to an embodiment of the disclosure.

FIG. 7A illustrates a side surface of the electronic device 100, when viewed from a cross-section of A-A' of FIG. 3, and FIG. 7B illustrates a side surface of the electronic device 100, when viewed from a cross-section of B-B' of FIG. 3.

Referring to FIGS. 7A and 7B, the first housing 110 may be covered by the first cover 111, and the first structure 131 that covers the hinge area 130 may be included in at at least a portion of the first housing 110.

According to an embodiment, the first antenna module 210 may be disposed in the first structure 131. For example, the first antenna module 210 may be disposed while being fixed to the first structure 131 by the fixing cap 510 and the second adhesive 530.

Referring to FIG. 7A, the electrical connection member 230 connected to the printed circuit board included in the first housing 110 may be inserted into a lower portion of the first structure 131 to be connected to the printed circuit board included in the second housing 120 via the hinge area 130.

According to an embodiment, a support member (not illustrated) that supports a battery (not illustrated) may be disposed in an area 710 of the first housing 110 that is adjacent to the battery (not illustrated). In an example, the support member (not illustrated) disposed in the area 710 of the first housing 110 may be a metal bracket.

According to an embodiment, the accommodation groove 410 and/or the hole 260 is disposed in the first structure 131 that covers the hinge area 130 at at least a portion of the first housing 110, and a heat dissipating structure (not illustrated) may be disposed in an area of the accommodation groove 410, in which the first antenna module 210 is seated, and/or the hole 260. The heat dissipating structure (not illustrated) may be disposed to be partially surrounded or be exposed to the hole area 260. For example, the area of the accommodation groove 410 may be formed of a metallic material, and the metallic material may be exposed to the hole 260. Because the heat dissipating structure (not illustrated) is configured to be partially surrounded or be exposed to the hole area 260, a heat emission phenomenon by the first antenna module 210 can be improved. The heat dissipating structure may be integrally formed with the first structure 131 or may be formed of a separate member.

Referring to FIG. 7B, the first FRC 240 connected to the printed circuit board included in the first housing 110 may be inserted between the first structure 131 and the first antenna module 210 to be electrically connected to the first antenna module 210.

According to an embodiment, a flexible display 112 disposed over the first housing 110 and the second housing 120 may be disposed on the front surface of the electronic device 100. In an example, the flexible display 112 may occupy most of the front surface of the electronic device 100.

According to an embodiment, the hinge area 130 may refer to an area that connects the first housing 110 and the second housing 120 such that the first housing 110 and the second housing 120 may be folded to face each other and then be unfolded.

Figure 8:
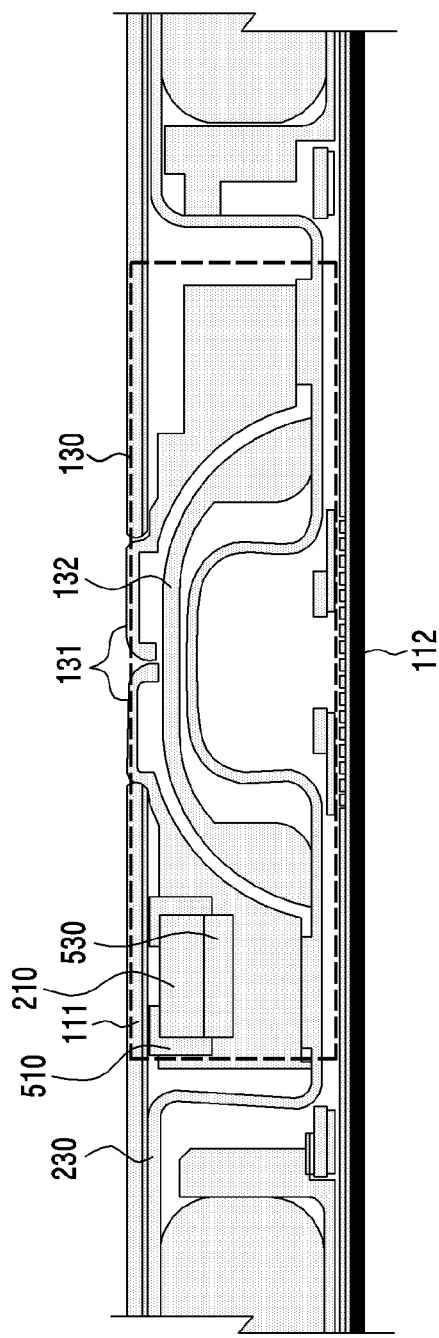
FIG. 8 is a side perspective view of an electronic device including a hinge driver part according to an embodiment of the disclosure.

FIG. 8 is a side perspective view of an electronic device including a hinge cover according to an embodiment of the disclosure.

Referring to FIG. 8, the hinge area 130 located between the first housing 110 and the second housing 120 may include a hinge cover 132.

According to an embodiment, the hinge cover 132 may be configured to cover a hinge driver (not illustrated). In an example, the hinge driver (not illustrated) may include a hinge housing, a rotary shaft, a fixing bracket, a plurality of gears, a cam, and/or a frictional plate.

According to an embodiment, the first housing 110 and the second housing 120 may be rotated through the hinge driver (not illustrated).

According to an embodiment, the electrical connection member 230 may be inserted into a lower portion of the first structure 131 and is expanded to the second housing 120 via an upper portion of the hinge driver (not illustrated), and may electrically connect the first housing 110 and the second housing 120.

As illustrated in FIG. 8, because the first antenna module 210 is disposed at at least a portion of the first structure 131 that covers the hinge area 130 of the electronic device 100, a space for disposing the first antenna module 210 can be secured.

Figures 9A, 9B:
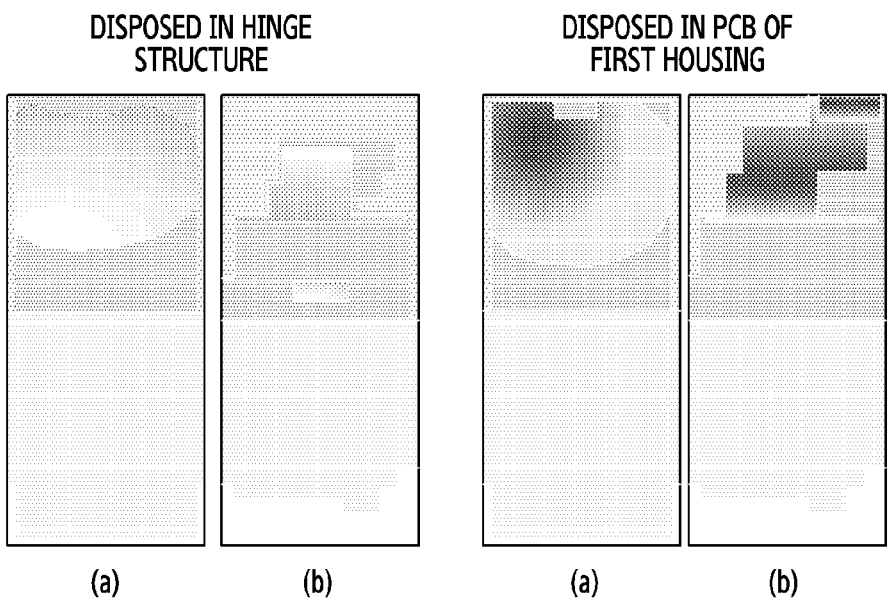
FIGS. 9A and 9B illustrates an antenna heat dissipation performance when an antenna module is disposed in a hinge structure according to various embodiments of the disclosure.

FIGS. 9A and 9B illustrate a heat dissipation performance of an antenna when the first antenna module is disposed in the first structure that covers the hinge area according to various embodiments of the disclosure.

FIG. 9A illustrates a view illustrating temperatures around an application processor (AP) disposed on the front surface of the first housing 110 when the first antenna module 210 is disposed in the hinge structure and is disposed in the PCB of the first housing 110, and FIG. 9B illustrates a view illustrating temperatures around the first antenna module 210 disposed on the rear surface of the first housing 110 when the first antenna module 210 is disposed in the hinge structure (not illustrated) and is disposed in the PCB of the first housing 110.

Referring to FIGS. 9A and 9B, a heat dissipation performance of an antenna when the first antenna module 210 is disposed in the first structure 131 that covers the hinge area 130 can be improved as compared with a heat dissipation performance of an antenna when the first antenna module 210 is disposed in the printed circuit board (PCB) of the first housing 110.

According to an embodiment, when the first antenna module 210 is disposed in the first structure 131, the heat dissipation performance can be improved because the dissipated thermal energy is decreased as compared with the case in which the first antenna module 210 is disposed in the printed circuit board (PCB) of the first housing 110. In an embodiment, when the first antenna module 210 is disposed in the first structure 131, a temperature around an application processor (AP) of the electronic device 100 may be 55.6 degrees, and when the first antenna module 210 is disposed in the printed circuit board (PCB) of the first housing 110, a temperature around the AP of the electronic device 100 may be 51.8 degrees. In another example, when the first antenna module 210 is disposed in the first structure 131, a temperature around the first antenna module 210 may be 51.8 degrees, and when the first antenna module 210 is disposed in the printed circuit board (PCB) of the first housing 110, a temperature around the first antenna module 210 may be 56.1 degrees.

As illustrated in FIGS. 9A and 9B, because the first antenna module 210 is disposed at at least a portion of the first structure 131 that covers the hinge area 130 of the electronic device 100, a heat emission phenomenon due to a patch antenna can be improved.

Figure 10:
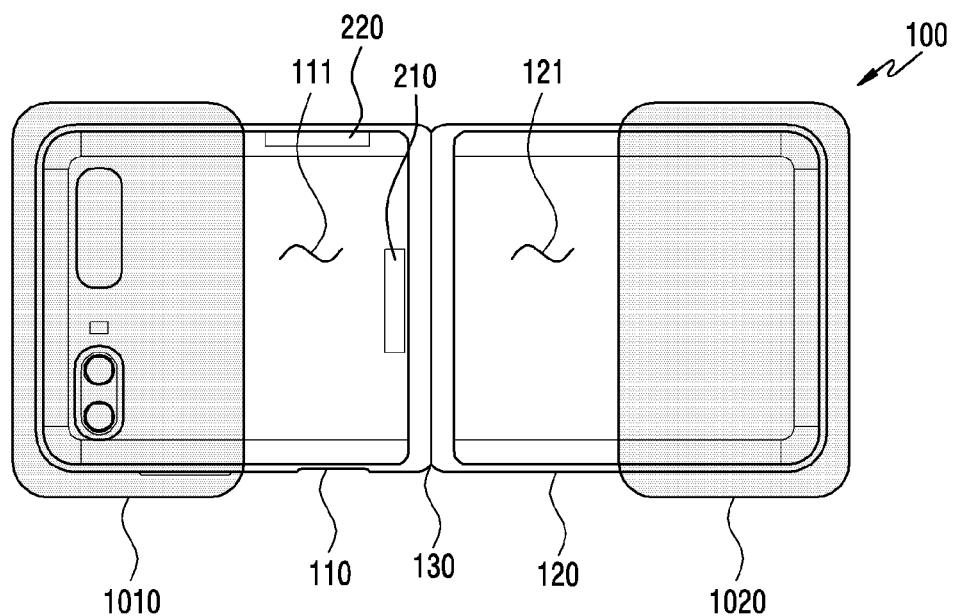
FIG. 10 illustrates a state, in which an electronic device is gripped transversely according to an embodiment of the disclosure.

FIG. 10 illustrates a state, in which an electronic device 100 is gripped transversely according to an embodiment of the disclosure.

Referring to FIG. 10, when the electronic device 100 is gripped transversely, a gripped part 1010 of the first housing 110 and a gripped part 1020 of the second housing 120 may not overlap areas, in which the first antenna module 210 and the second antenna module 220 are located.

According to an embodiment, the gripped part 1010 of the first housing 110 may be located at at least a portion of the first cover 111 that covers the first housing 110, and the gripped part 1020 of the second housing 120 may be located at at least a portion of the second cover 121 that covers the second housing 120.

In an embodiment, because the gripped part 1010 of the first housing 110 does not overlap the areas, in which the first antenna module 210 and/or the second antenna module 220 is located, deterioration of the radiation performance of the first antenna module 210 and/or the second antenna module 220 due to the gripping may be reduced. For example, a user uses the electronic device 100 transversely, the deterioration of the antenna radiation performance of the first antenna module 210 can be reduced by disposing the first antenna module 210 around the hinge area 130 that is a part that is not gripped by the user.

Figure 11:
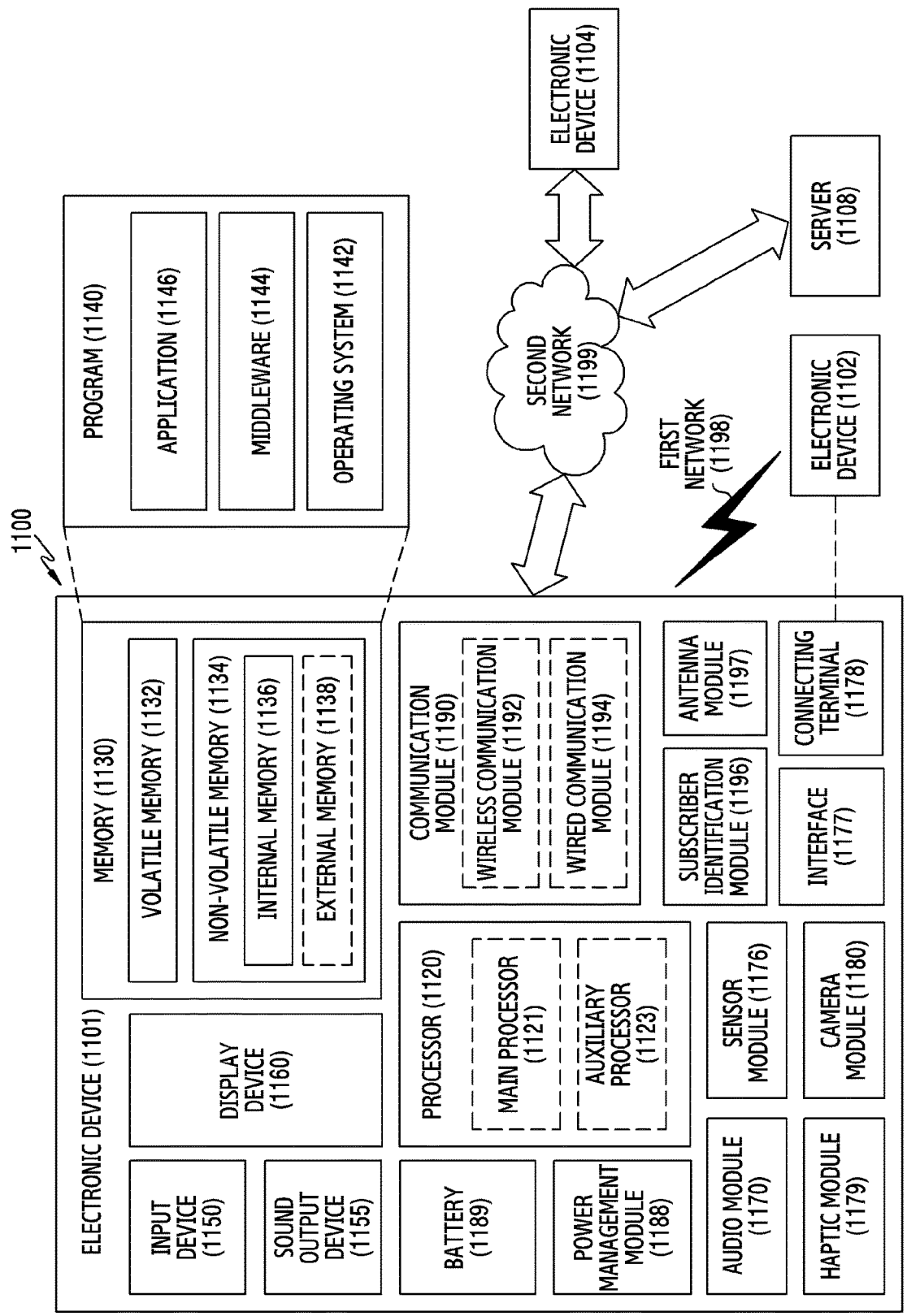
FIG. 11 illustrates a block diagram of an electronic device in a network environment according to an embodiment of the disclosure.

FIG. 11 is a block diagram illustrating an electronic device in a network environment according to an embodiment of the disclosure.

Referring to FIG. 11, the electronic device 1101 (e.g., the electronic device 100 of FIG. 1A or FIG. 1B) in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In some embodiments, at least one of the components (e.g., the connecting terminal 1178) may be omitted from the electronic device 1101, or one or more other components may be added in the electronic device 1101. In some embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thererto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™ wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In another embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

Figure 12:
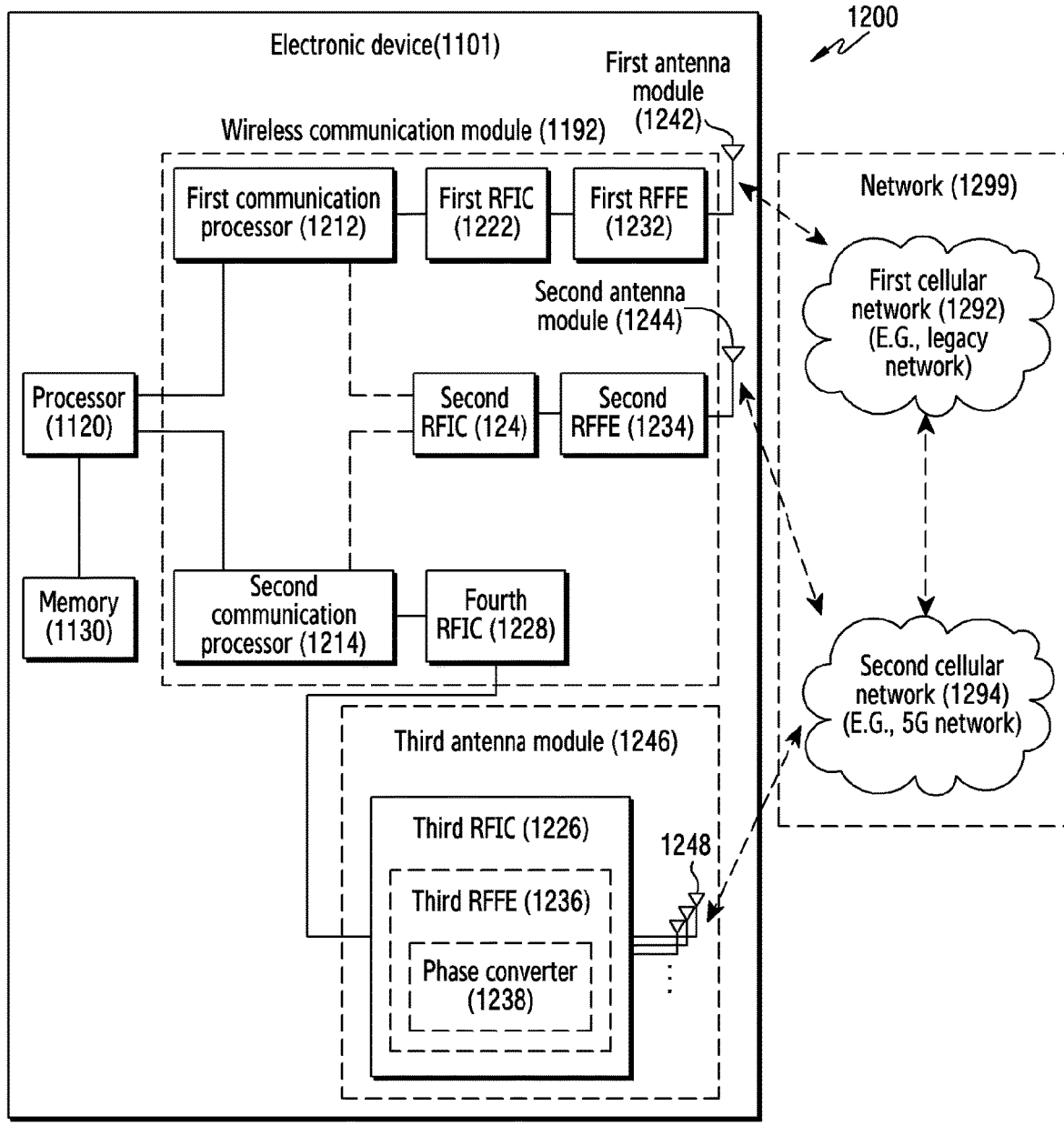
FIG. 12 is a block diagram of an electronic device in a network environment including a plurality of cellular networks according to an embodiment of the disclosure.

FIG. 12 is a block diagram of an electronic device in a network environment including a plurality of cellular networks according to an embodiment of the disclosure.

Referring to FIG. 12, an electronic device 1101 (e.g., the electronic device 100 of FIGS. 1A and 1B) may include a first communication processor 1212, a second communication processor 1214, a first radio frequency integrated circuit (RFIC) 1222, a second RFIC 1224, a third RFIC 1226, a fourth RFIC 1228, a first radio frequency front end (RFFE) 1232, a second RFFE 1234, a first antenna module 1242, a second antenna module 1244, and an antenna 1248. The electronic device 1101 may further include a processor 1120 and a memory 1130. A second network 1199 may include a first cellular network 1292 and a second cellular network 1294. According to another embodiment, the electronic device 1101 may further include at least one of the components illustrated in FIGS. 1A and 1B, and the second network 1199 may further include at least one another network. According to an embodiment, the first communication processor 1212, the second communication processor 1214, the first RFIC 1222, the second RFIC 1224, the fourth RFIC 1228, the first RFFE 1232, and the second RFFE 1234 may constitute at least a portion of the wireless communication module 1192. According to another embodiment, the fourth RFIC 1228 may be omitted or may be included at a part of the third RFIC 1226.

The first communication processor 1212 may establish a communication channel of a band that is to be used for wireless communication with the first cellular network 1292, and may support legacy network communication through the established communication channel. According to various embodiments, the first cellular network may be a legacy network including 2-generation (2G), 3G, 4G, or long-term evolution (LTE). The second communication processor 1214 may establish a communication channel corresponding to a designated one (e.g., about 6 GHz to about 60 GHz) of bands that are to be used for wireless communication with the second cellular network 1294, and may support 5G network communication through the established communication channel. According to various embodiments, the second cellular network 1294 may be a 5G network defined by a 3GPP. In addition, according to an embodiment, the first communication processor 1212 or the second communication processor 1214 may establish a communication channel corresponding to another designated one (e.g., about 6 GHz or less) of bands that are to be used for wireless communication with the second cellular network 1294, and may support 5G network communication through the established communication channel. According to an embodiment, the first communication processor 1212 and the second communication processor 1214 may be implemented in a single chip or a single package. According to various embodiments, the first communication processor 1212 or the second communication processor 1214 may be disposed in a single chip or a single package together with the processor 1120, the auxiliary processor 1123, or the communication module 1190.

According to an embodiment, the first communication processor 1212 and the second communication processor 1214 may be directly or indirectly connected to each other by an interface (not illustrated), and may provide or receive data or control signals in any one direction or in opposite directions.

The first RFIC 1222 may convert a baseband signal generated by the first communication processor 1212 into a radio frequency signal of about 700 MHz to about 3 GHz used for the first cellular network 1292 (e.g., the legacy network) during transmission of signals. An RF signal may be acquired from the first cellular network 1292 (e.g., the legacy network) through an antenna (e.g., the first antenna module 1242) and preprocess the acquired RF signal through an RFFE (e.g., the first RFFE 1232) during reception of signals. The first RFIC 1222 may convert the preprocessed RF signal to a baseband signal such that the preprocessed RF signal is processed by the first communication processor 1212.

The second RFIC 1224 may convert a baseband signal generated by the first communication processor 1212 or the second communication processor 1214 to an RF signal (hereinafter, a 5G sub6 RF signal) of a Sub6 band (e.g., about 6 GHz or less) used for the second cellular network 1294 (e.g., the 5G network) during transmission of signals. A 5G Sub6 RF signal may be acquired from the second cellular network 1294 (e.g., the 5G network) through an antenna (e.g., the second antenna module 1244) and may preprocess the acquired RF signal through an RFFE (e.g., the second RFFE 1234) during reception of signals. The second RFIC 1224 may convert the processed 5G Sub6 RF signal to a baseband signal such that the 5G Sub6 RF signal is processed by a corresponding one of the first communication processor 1212 or the second communication processor 1214.

The third RFIC 1226 may convert a baseband signal generated by the second communication processor 1214 into an RF signal (hereinafter, a 5G Above6 RF signal) of a 5G Above6 band (e.g., about 6 GHz to about 60 GHz) that is to be used for the second cellular network 1294 (e.g., the 5G network). A 5G Sub6 RF signal may be acquired from the second cellular network 1294 (e.g., the 5G network) through an antenna (e.g., the antenna 1248) and may be preprocessed through the third RFFE 1236 during reception of signals. The third RFIC 1226 may convert the preprocessed 5G Above6 RF signal to a baseband signal such that the preprocessed 5G Above6 RF signal is processed by the second communication processor 1214. According to another embodiment, the third RFIC 1226 may be included at a part of the third RFIC 1226.

According to an embodiment, the electronic device 1101 may include the fourth RFIC 1228 separately from the third RFIC 1226 or as at least a part of the third RFIC 1226. In this case, the fourth RFIC 1228 may convert the baseband signal generated by the second communication processor 1214 into an RF signal (hereinafter, an IF signal) of an intermediate frequency band (e.g., about 9 GHz to about 11 GHz), and then may deliver the IF signal to the third RFIC 1226. The third RFIC 1226 may covert the IF signal to a 5G Above6RF signal. A 5G Above6 RF signal may be received from the second cellular network 1294 (e.g., the 5G network) through an antenna (e.g., the antenna 1248) and may be converted to an IF signal by the third RFIC 1226. The fourth RFIC 1228 may convert the IF signal to a baseband signal such that the IF signal is processed by the second communication processor 1214.

According to an embodiment, the first RFIC 1222 and the second RFIC 1224 may be implemented as at least a portion of a single chip or a single package. According to an embodiment, the first RFFE 1232 and the second RFFE 1234 may be implemented as at least a portion of a single chip or a single package. According to an embodiment, at least one of the first antenna module 1242 or the second antenna module 1244 may be omitted or coupled to another antenna module to process RF signals of a plurality of corresponding bands.

According to an embodiment, the third RFIC 1226 and the antenna 1248 may be disposed in the same sub-straight to constitute the third antenna module 1246. For example, the wireless communication module 1192 or the processor 1120 may be disposed in a first sub-straight (e.g., a main PCB). The third RFIC 1226 may be disposed in a partial area (e.g., a lower surface) of a second sub-straight (e.g., a sub-PCB) that is separate from the first sub-straight and an antenna 1248 may be disposed in another partial area (e.g., an upper surface) to constitute the third antenna module 1246. The length of a transmission line between the third RFIC 1226 and the antenna 1248 can be reduced by arranging the third RFIC 1226 and the antenna 1248 in the same sub-straight. For example, this can reduce loss of a signal of a high-frequency band (e.g., about 6 GHz to about 60 GHz) used for the 5G network communication due to the transmission line. Accordingly, the electronic device 1101 can improve the quality or speed of the communication with the second cellular network 1294 (e.g., the 5G network).

According to an embodiment, the antenna 1248 may be constituted by an antenna array including a plurality of antenna elements that may be used for beam forming. For example, the third RFIC 1226 may be a portion of the third RFFE 1236, and may include a plurality of phase shifters 1238 corresponding to the plurality of antenna elements. During transmission of signals, the plurality of phase shifters 1238 may shift the phase of a 5G Above6 RF signal that is to be transmitted to the outside (e.g., a base station of the 5G network) of the electronic device 1101 through the corresponding antenna elements. During reception of signals, the plurality of phase shifters 1238 may convert the phase of the 5G Above6 RF signal received from the outside through the corresponding antenna elements to the same or substantially the same phase. This makes transmission or reception of signals through beam forming between the electronic device 1101 and the outside.

The second cellular network 1294 (e.g., the 5G network) may be operated independently (e.g., standalone (SA) from or in conjunction with (e.g., non-standalone (NSA) the first cellular network 1292 (e.g., the legacy network). For example, only an access network (e.g., a 5G radio access network (RAN) or a next generation (NG) RAN may be present in the 5G network, and a core network (e.g., a next generation core (NGC) may not be present. The electronic device 1101 may access an access network of the 5G network, and may access an external network (e.g., the internet) under the control of a core network (e.g., an evolved packed core (EPC) of the legacy network. Protocol information (e.g., LTE protocol information) for communication with the legacy network or protocol information (e.g., a new radio (NR) protocol information) for communication with the 5G network may be stored in the memory 1130, and be accessed by another component (e.g., the processor 1120, the first communication processor 1212, or the second communication processor 1214).

An electronic device 100 according to various embodiments may include a first housing 110, a second housing 120 coupled to the first housing 110 through a hinge structure to be rotatable about a first axis (e.g., the +x axis of FIG. 1A) that faces a first direction (e.g., the +x axis direction of FIG. 1A), a flexible display 112 defining a front surface of the electronic device 100 and disposed over the first housing 110 and the second housing 120, an antenna module (e.g., the first antenna module 210 of FIG. 2), and at least one processor electrically connected to the flexible display 112 and the antenna module, the hinge structure may be disposed in an area having a first width in a second direction (e.g., the +y axis direction of FIG. 1A) that is perpendicular to the first direction with respect to the first axis, the first housing has a first structure 131 covering the hinge structure within the first width, the first structure 131 may have an accommodation groove 410, in which the antenna module (e.g., the first antenna module 210 of FIG. 2) is accommodated, and the at least one processor may be configured to transmit and receive a millimeter wave signal corresponding to a third direction (e.g., the +z axis direction of FIG. 1A) that is perpendicular to both the first direction (e.g., the +x axis direction of FIG. 1A) and the second direction (e.g., the +y axis direction of FIG. 1A) by using the antenna module (e.g., the first antenna 210 of FIG. 2).

The electronic device 100 according to an embodiment may further include a battery, the first housing 110 may have a second structure, in which the battery is accommodated, and the antenna module (e.g., the first antenna module 210 of FIG. 2) may be disposed in the accommodation groove 410 between the battery and the first axis.

According to an embodiment, the antenna module may be a first antenna module 210, and the electronic device may further include a second antenna module 220, the second antenna module 220 may be accommodated in a third structure formed along a side surface of the first housing, and the at least one processor may be configured to transmit and receive a millimeter wave signal corresponding to the first direction or the second direction by using the second antenna module 220.

According to an embodiment, the antenna module (e.g., the first antenna module 210 of FIG. 2) may be an array antenna.

According to an embodiment, the accommodation groove 410 may include a fixing part, and the antenna module (e.g., the first antenna module 210 of FIG. 2) may be accommodated in the accommodation groove by the fixing part.

According to an embodiment, the fixing part may include at least one of a fixing cap 510, a first adhesive 520 configured to fix the fixing cap 510, or a second adhesive 530 located on a surface of the antenna module (e.g., the first antenna module 210 of FIG. 2), which is different from a surface of the antenna module, on which the first adhesive 520 configured to fix the fixing cap 510 is located.

According to an embodiment, the first axis may correspond to one of a transverse axis or a longitudinal axis of the electronic device, which is shorter.

According to an embodiment, the flexible display 112 may be formed such that a portion thereof is bent as the second housing is rotated about a first axis with respect to the first housing.

According to an embodiment, the accommodation groove 410, in which the antenna module (e.g., the first antenna module 210 of FIG. 2) is accommodated, may be formed of a metallic material.

The electronic device 100 according to an embodiment may further include a support member in an interior of the first housing 110, and the support member may be a heat dissipating structure.

According to an embodiment, the heat dissipating structure may be at least one of a graphite bracket or a metal bracket.

The electronic device 100 according to an embodiment may further include a printed circuit board (PCB).

The electronic device 100 according to an embodiment may further include a flexible printed circuit board (FPCB) or an FPCB RF cable (FRC) electrically connected to the PCB.

The electronic device 100 according to an embodiment may include a first cover 111 covering a rear surface of the first housing 110, a second cover 121 covering a rear surface of the second housing 120, and the first cover 111 and the second cover 121 may be formed of a nonconductive material.

According to an embodiment, the millimeter wave signal is a signal at a frequency band of 24.25 GHz or 40 GHz.

An electronic device 100 according to various embodiments may include a first housing 110, a second housing 120 coupled to the first housing 110 through a hinge structure to be rotatable about a first axis (e.g., the +x axis of FIG. 1A) that faces a first direction (e.g., the +x axis direction of FIG. 1A), a first cover 111 covering a rear surface of the first housing, a second cover 121 covering a rear surface of the second housing, an antenna module, and at least one processor electrically connected to the antenna module (e.g., the first antenna module 210 of FIG. 2), the hinge structure may be disposed in an area having a first width in a second direction (e.g., the +y axis direction of FIG. 1A) that is perpendicular to the first direction with respect to the first axis, the first housing may have a first structure covering the hinge structure within the first width, the first structure may have an accommodation groove 410, in which the antenna module is accommodated, and the at least one processor may be configured to transmit and receive a millimeter wave signal corresponding to a third direction (e.g., the +z axis direction of FIG. 1A) that is perpendicular to both the first direction (e.g., the +x axis direction of FIG. 1A) and the second direction (e.g., the +y axis direction of FIG. 1A) by using the antenna module (e.g., the first antenna module 210 of FIG. 2).

The electronic device 100 according to an embodiment may further include a battery, the first housing 110 may have a second structure, in which the battery is accommodated, and the antenna module (e.g., the first antenna module 210 of FIG. 2) may be disposed in the accommodation groove between the battery and the first axis.

According to an embodiment, the antenna module may be a first antenna module 210, the electronic device may further include a second antenna module 220, and the second antenna module 220 may be accommodated in a third structure formed along a side surface of the first housing 110.

According to an embodiment, the antenna module (e.g., the first antenna module 210 of FIG. 2) may be an array antenna.

According to an embodiment, the accommodation groove 410 may include a fixing part, and the antenna module (e.g., the first antenna module 210 of FIG. 2) may be accommodated in the accommodation groove 410 by the fixing part.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing including:
a first housing, and
a second housing coupled to the first housing through a hinge to be rotatable about a first axis;
a hinge cover for covering the hinge;
a flexible display forming a front surface of the electronic device and disposed over the first housing and the second housing;
an antenna circuitry; and
at least one processor electrically connected to the flexible display and the antenna circuitry,
wherein the first housing includes a first portion which covers at least a portion of the hinge cover when the housing is unfolded,
wherein the first portion includes a groove, in which the antenna circuitry is disposed, and
wherein the at least one processor is configured to transmit and receive a millimeter wave signal using the antenna circuitry.

2. The electronic device of claim 1, further comprising:
a battery,
wherein the first housing includes a second, portion in which the battery is disposed, and
wherein the antenna circuitry is disposed in the groove between the battery and the hinge cover.

3. The electronic device of claim 1,
wherein the antenna circuitry is a first antenna circuitry,
wherein the electronic device further comprises a second antenna circuitry,
wherein the second antenna circuitry is disposed in a third portion formed along a side surface of the first housing, and
wherein the at least one processor is further configured to transmit and receive a millimeter wave signal using the second antenna circuitry.

4. The electronic device of claim 1, wherein the antenna circuitry includes antenna elements for an array antenna.

5. The electronic device of claim 1,
wherein the groove includes a fixing part portion, and
wherein the antenna circuitry is fixed to the groove by the fixing portion.

6. The electronic device of claim 5, wherein the fixing portion comprises at least one of a fixing cap, a first adhesive configured to fix the fixing cap and disposed on a first surface of the antenna circuitry, or a second adhesive disposed on a second surface of the antenna circuitry.

7. The electronic device of claim 1, wherein the first axis corresponds to one of a transverse axis or a longitudinal axis of the electronic device.

8. The electronic device of claim 1, wherein the flexible display includes a portion bent as the second housing rotates about the first axis.

9. The electronic device of claim 1, wherein at least a portion of the groove is formed of a conductive or metallic material.

10. The electronic device of claim 1, further comprising:
a support member formed in an interior of the first housing,
wherein the support member is a heat dissipating structure.

11. The electronic device of claim 10, wherein the heat dissipating structure is at least one of a graphite bracket or a metal bracket.

12. The electronic device of claim 1, further comprising:
a printed circuit board (PCB).

13. The electronic device of claim 12, further comprising:
a flexible printed circuit board (FPCB) or an FPCB radio frequency (RF) cable (FRC) electrically connected to the PCB.

14. The electronic device of claim 1, further comprising:
a first cover covering a rear surface of the first housing; and
a second cover covering a rear surface of the second housing,
wherein the first cover and the second cover are formed of a nonmetallic material.

15. The electronic device of claim 1, wherein the millimeter wave signal is a signal at a frequency band of 24.25 GHz or 40 GHz.

16. An electronic device comprising:
a housing including:
a first housing, and
a second housing coupled to the first housing through a hinge to be rotatable about a first axis;
a hinge cover for covering the hinge;
a first cover for covering a rear surface of the first housing;
a second cover for covering a rear surface of the second housing;
an antenna circuitry; and
at least one processor electrically connected to the antenna circuitry,
wherein the first housing includes a first portion which covers at least a portion of the hinge cover when the housing is unfolded,
wherein the first portion includes a groove, in which the antenna circuitry is disposed, and
wherein the at least one processor is configured to transmit and receive a high frequency signal using the antenna circuitry.

17. The electronic device of claim 16, further comprising:
a battery,
wherein the first housing includes a second portion in which the battery is disposed, and
wherein the antenna circuitry is disposed in the groove between the battery and the hinge cover.

18. The electronic device of claim 16,
wherein the antenna circuitry is a first antenna circuitry,
wherein the electronic device further comprises a second antenna circuitry,
wherein the second antenna circuitry is disposed in a third portion formed along a side surface of the first housing, and
wherein the at least one processor is further configured to transmit and receive a millimeter wave signal using the second antenna circuitry.

19. The electronic device of claim 16, wherein the antenna circuitry includes antenna elements for an array antenna.

20. The electronic device of claim 16,
wherein the groove includes a fixing portion, and
wherein the antenna circuitry is fixed to the groove by the fixing portion.

21. The electronic device of claim 18, wherein the second antenna circuitry is disposed parallel to the first axis to perform antenna radiation.

22. The electronic device of claim 18, wherein the second antenna circuitry is disposed parallel to a second axis that is perpendicular to the first axis to perform antenna radiation.

* * * * *